United States Patent
Watkins et al.

(10) Patent No.: US 6,933,724 B2
(45) Date of Patent: Aug. 23, 2005

(54) MATRIX COIL FOR GENERATING A VARIABLE MAGNETIC FIELD

(75) Inventors: Ronald Dean Watkins, Niskayuna, NY (US); Harvey Ellis Cline, Schenectady, NY (US); Douglas Arthur Kelley, Rockville, MD (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/719,118

(22) Filed: Nov. 21, 2003

(65) Prior Publication Data

US 2005/0110492 A1     May 26, 2005

(51) Int. Cl.$^7$ .............................................. G01V 3/00
(52) U.S. Cl. ..................... 324/319; 324/320
(58) Field of Search .............................. 324/319, 320, 324/322, 318, 300, 307, 309; 335/296, 299

(56) References Cited

U.S. PATENT DOCUMENTS

| | | | |
|---|---|---|---|
| 5,530,355 A | | 6/1996 | Doty .......................... 324/318 |
| 5,554,929 A | | 9/1996 | Doty et al. ................. 324/318 |
| 5,661,401 A | * | 8/1997 | Ishikawa et al. ............ 324/320 |
| 6,067,001 A | * | 5/2000 | Xu et al. .................... 335/299 |
| 6,492,817 B2 | * | 12/2002 | Gebhardt et al. ........... 324/318 |

* cited by examiner

*Primary Examiner*—Louis Arana
(74) *Attorney, Agent, or Firm*—Jean K. Testa; Patrick K. Patnode

(57) ABSTRACT

A matrix coil for generating a variable magnetic field is provided, including a plurality of loops arranged in a series so as to have a substantially common axis and segmented into at least one arc-shaped segment, a variable current source for each of the arc-shaped segments, and a controller. The controller is configured to selectively vary an amount of current provided to each of the arc-shaped segments by the variable current sources so as to achieve a variable base field, one or more variable gradient fields, and one or more variable second order shim fields.

24 Claims, 2 Drawing Sheets

MATRIX COIL FOR GENERATING A VARIABLE MAGNETIC FIELD

BACKGROUND OF THE INVENTION

The present invention relates generally to matrix coils for generating variable magnetic fields, and more particularly to magnetic resonance imaging (MRI) devices including matrix coil structures.

Coil structures for generating magnetic fields are known. Exemplary coil structures include those described in U.S. Pat. No. 5,554,929 (the "'929 patent" hereafter) and U.S. Pat. No. 5,530,355 (the "'355 Patent" hereafter), which are incorporated by reference herein in their entirety. Other configurations also exist.

Known coil structures have been used generate magnetic fields for medical imaging devices, such as magnetic resonance imaging (MRI) devices. In typical MRI device applications, the magnetic fields generated by a plurality of coil structures are combined to generate a target magnetic field for imaging a volume. In particular, each of the plurality of coil structures is positioned in a particular pre-selected location during a manufacturing process, such that, during operation of the MRI device, each of the plurality of coil structures generates one of a main magnetic field, a gradient field, and a higher order shim field, the combination of which results in the target magnetic field.

As the pre-selected location of the coil structures is set during the manufacturing process, known MRI devices do not have the ability to make substantial changes in the target magnetic field. Thus, the adjustability and configurability of known MRI devices is limited. Hence, a need exists for an improved coil structure, particularly for use in MRI devices.

BRIEF SUMMARY OF THE INVENTION

According to one embodiment of the present invention, a matrix coil for generating a variable magnetic field is provided, including a plurality of loops arranged in a series so as to have a substantially common axis and segmented into at least one arc-shaped segment, a variable current source for each of the arc-shaped segments, and a controller. The controller is configured to selectively vary an amount of current provided to each of the arc-shaped segments by the variable current sources so as to achieve a variable base field, one or more variable gradient fields, and one or more variable second order shim fields.

According to another embodiment of the present invention, a method of generating a variable magnetic field is provided. The method includes steps of supplying a current to each of a plurality of arc-shaped segments within each of a plurality of loops, and selectively varying the supplied current provided to each of the plurality of arc-shaped segments. The plurality of loops are arranged in a series so as to have a substantially common axis, and the supplied current is selectively varied to achieve a variable base field, one or more variable gradient fields, and one or more variable second order shim fields.

According to another embodiment of the present invention, a magnetic resonance imaging device (MRI) is provided, including means for generating a variable base field, one or more variable gradient fields, and one or more variable second order shim fields, means for supplying a current to the means for generating so as to achieve a target field for an imaging region of interest, and means for determining a required current to achieve the target field for the imaging region of interest.

DETAILED DESCRIPTION OF THE INVENTION

Reference will now be made in detail to presently preferred embodiments of the present invention. Wherever possible, the same reference numbers will be used throughout the drawings to refer to the same or like parts.

Figure 1:
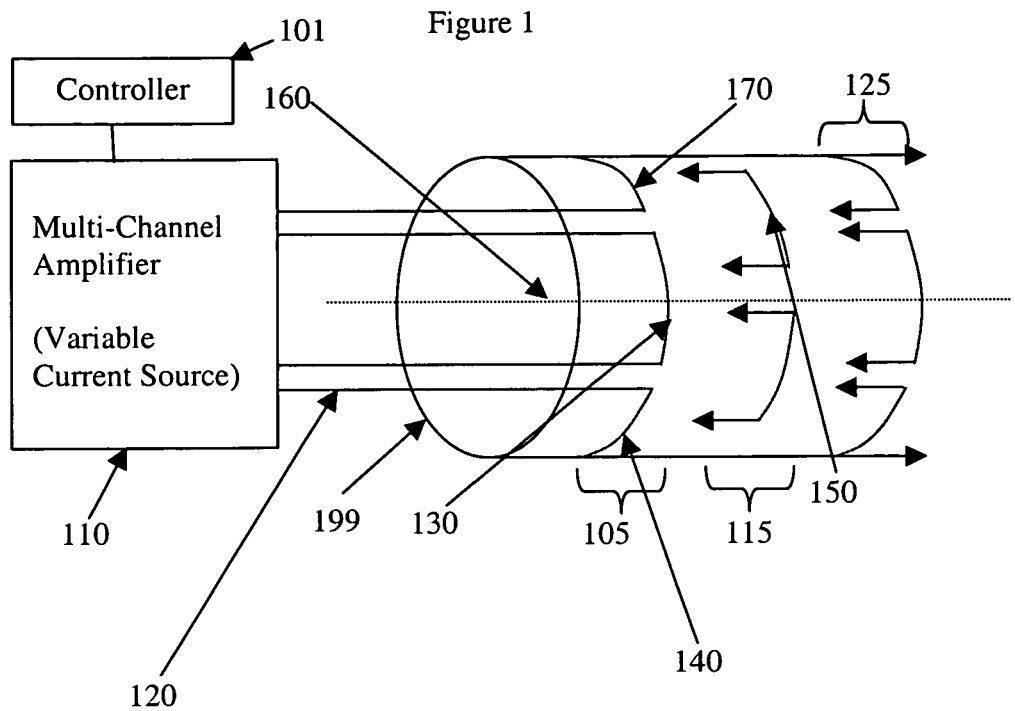
FIG. 1 is a block diagram of a coil structure according to an embodiment of the present invention.

A matrix coil for generating a variable magnetic field according to a first embodiment of the present invention is shown in the block diagram of FIG. 1. The matrix coil includes a plurality of loops 105, 115, 125 arranged in a series so as to have a substantially common axis 160, each of the plurality of loops 105, 115, 125 being segmented into arc-shaped segments as shown. By way of example, loop 105 is shown with arc-shaped segments 130, 140, 170. It should be appreciated that each loop in the plurality of loops 105, 115, 125 may be segmented into any number of arc-shaped segments (e.g., one or more arc-shaped segments per loop 105, 115, 125), and the number of arc-shaped segments in a given loop 105, 115, 125 may vary from one loop to another. Preferably, the arc-shaped segments in consecutive loops are offset in a radial direction from one another, such as arc-shaped segments 130 and 150 depicted in FIG. 1. Other configurations, such as arc-shaped segments in consecutive loops being substantially aligned are also contemplated.

While the specific number of loops and arc-shaped segments may vary, according to one preferred embodiment of the present invention, the matrix coil includes at least 32 loops, each of the at least 32 loops being segmented into at least 8 arc-shaped segments. The plurality of loops may be arranged about a substantially cylindrical substrate 199 as shown, preferably having a diameter of at least 70 cm and a length of at least 200 cm.

The matrix coil further includes a variable current source 110 for each of the plurality of arc-shaped segments, such as a multi-channel amplifier having individual channels dedicated to respective arc-shaped segments. The variable current source 110 may be coupled to a controller 101, such as a processor or special purpose device (e.g., an application specific integrated circuit (ASIC)), for controlling an amount of current provided to each of the plurality of arc-shaped segments by the variable current source 110. In this regard, the controller 101 may comprise a separate component from the variable current source 110, or the controller 101 and variable current source 110 may be combined into a single integrated unit. Preferably, the controller 101 includes a memory for storing a look-up table listing the amount of current provided to each of the plurality of loops to achieve a target field for an imaging region of interest. In this manner, a target field requirement can be entered into the controller 101, which controls the variable current source 110 to supply the requisite currents listed in the look-up table so as to achieve the target field requirement.

Preferably, the arc-shaped segments are electrically coupled to the variable current source 110 by a plurality of current leads 120 arranged so as to be substantially parallel to the central axis 160. The current leads 120 arranged so as to be substantially parallel to the central axis 160 in order to inhibit magnetic interference related to the supply of current to the arc-shaped segments. In this regard, the current leads 120 supplying current to loop 115 and loop 125 are only partially shown for simplicity of illustration. It should further be appreciated that, while only one variable current source 110 is shown, multiple multi-channel amplifiers or the like may be provided depending on the particular implementation at hand.

As previously noted, the controller 101 is configured to selectively vary an amount of current provided to each of the plurality of arc-shaped segments by the variable current sources so as to achieve a variable base field ($B_0$), one or more variable gradient fields ($G_x+G_y+G_z$), and one or more variable second order shim fields ($Z_x+Z_y+Z_2+C_2+S_2+Z_3$). According to one embodiment of the present invention, a target field ($B_z$) for an imaging region of interest is achieved by creating a specific base field ($B_0$), one or more variable gradient fields ($G_x+G_y+G_z$), and one or more variable second order shim fields ($Z_x+Z_y+Z_2+C_2+S_2+Z_3$) that are combined to create the target field ($B_z$). By way of example, the controller 101 may selectively vary the amount of current provided to each of the plurality of arc-shaped segments in accordance with a discrete approximation of a gradient current density stream function. This gradient current density stream function may be used to calculate the values stored in the previously described look-up table, or be used to calculate requisite currents "on the fly".

Figure 4:
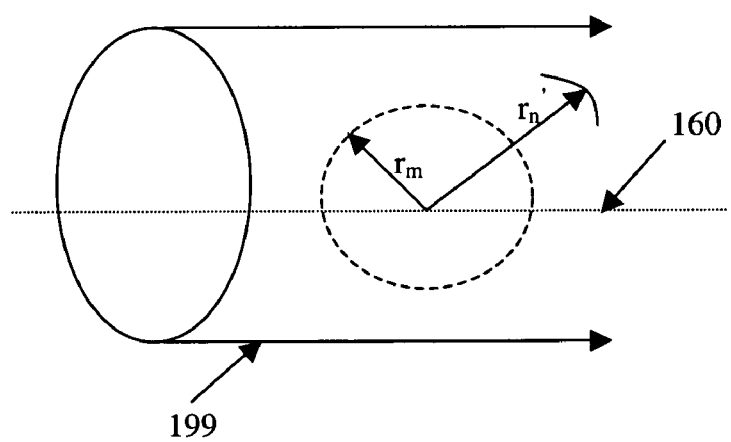
FIG. 4 is a block diagram of a target magnetic field at a sampling point according to another embodiment of the present invention.

One such technique involves varying the amount of current provided to each of N arc-shaped segments in accordance with the following equation (see also FIG. 4):

$$B_z(r_m) = \frac{\mu}{4\pi} \sum_{n=1}^{N} I_n \oint \frac{ds[\varphi \circ (r'_n - r_m)]_Z}{|r'_n - r_m|^3} \quad \text{(Equation 1)}$$

where $r_m$ are the $m^{th}$ sample point in the target field, m being an integer greater than 1, and where $r_n$ are position current elements $ds_n$ along the $n^{th}$ arc of the N arc-shaped segments, N being an integer greater than 1, where $I_n$ is the current in the $N_{th}$ arc-shaped segment, and $[ds_n \times (|r_n - r_m|)]_z$ is the z component of the vector cross product.

In the aforementioned Equation 1, the target magnetic field $B_z$ is modified by the sum of the matrix currents according to the Biot-Savart Law. In particular, the control currents of the N matrix elements are determined by a least squares fit of the target field $B_z$ at the sample points m defining the region of interest. More specifically, the target field $B_z$ is set to the gradients X, Y and Z or a mixture as the pulse sequence is executed in real time.

Additionally, desired variable second order shim field(s) can be achieved by selectively varying the amount of current provided to each of the plurality of arc-shaped segments (e.g., to improve homogeneity across the target field $B_z$) in accordance with the following equations:

$$I_q = \frac{4\pi}{\mu} \sum_q \sum_m (A^T_{qm} A_{mn})^{-1} A^T_{nm} B z_m \quad \text{(Equation 2)}$$

$$A_{mn} = \oint \frac{ds[\varphi \circ (r'_n - r_m)]_Z}{|r'_n - r_m|^3} \quad \text{(Equation 3)}$$

where $A^T_{qm}$ and $A^T_{nm}$ are transpose matrices with the columns and rows interchanged It should be appreciated that the aforementioned Equations 1–3 are provided for purposes of illustration only. Other control techniques may also be used, as would be readily apparent to one of ordinary skill in the art after reading this disclosure.

The aforementioned configuration is capable of achieving a variable/adjustable magnetic field for imaging a volume by changing the amount of current provided to each of the arc-shaped segments. As such, the aforementioned configuration provides a greater degree of adjustability than known coil structures. While reconfiguration time (i.e., the time it takes to switch from one target magnetic field to another magnetic field) may vary depending on the implementation specifics, the maximum reconfiguration time may be limited by nerve stimulation limitations of the human body.

Figure 2:
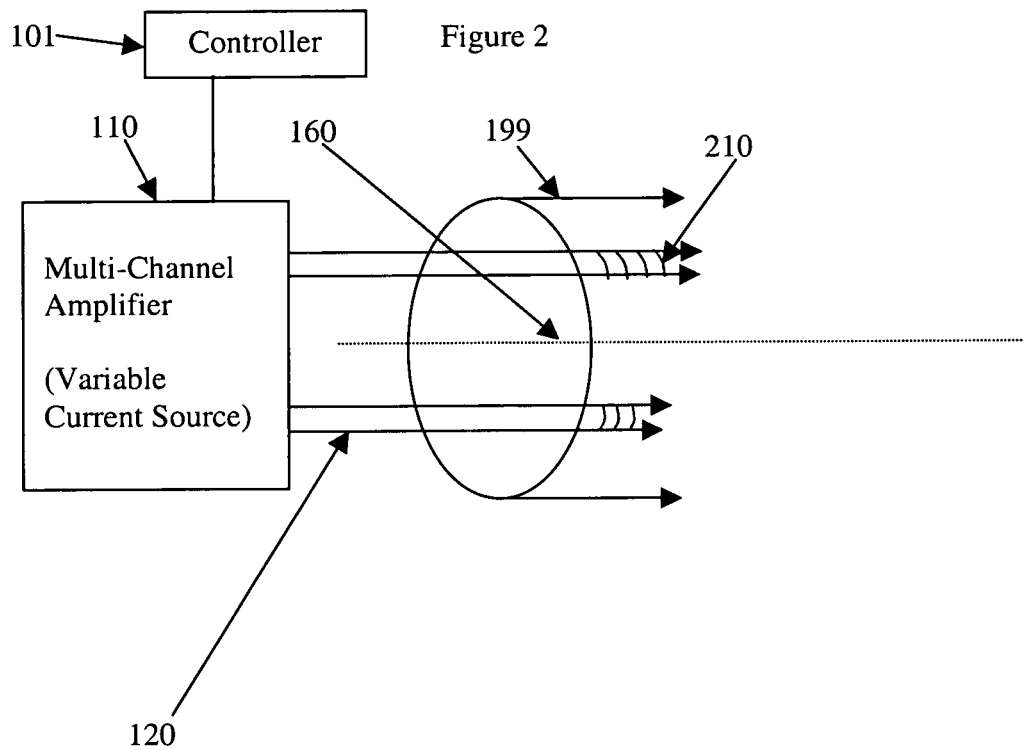
FIG. 2 is a block diagram of a coil structure with an array of current elements according to another embodiment of the present invention.

To further improve the variability of the target field ($B_z$), an array of current elements 210 connected by current leads 120 may be provided, preferably arranged in the configuration shown in FIG. 2. In this regard, the array of current elements 210 provides greater control of the magnetic field generated along the z axis. Other configurations are also contemplated, as would be readily apparent to one of ordinary skill in the art after reading this disclosure.

Figure 3:
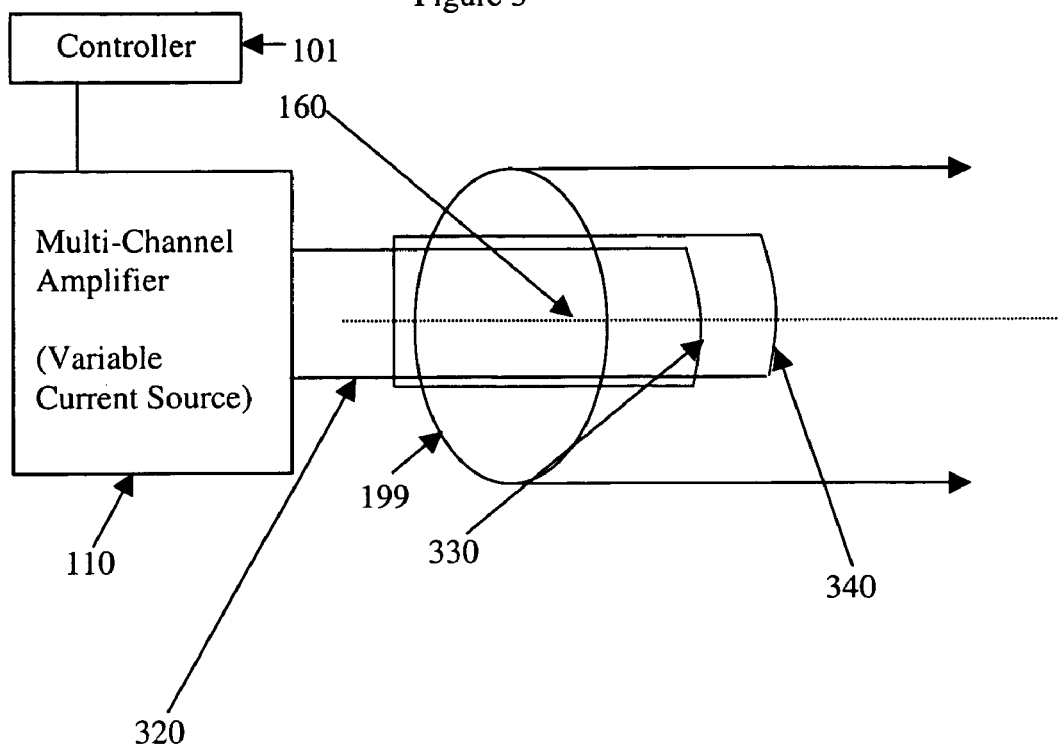
FIG. 3 is a block diagram of a coil structure with series connected arc-shaped segments according to another embodiment of the present invention.

According to another embodiment of the present invention as shown in FIG. 3, two or more arc-shaped segments 330, 340 in different loops (preferably adjacent loops) may be connected in series, such that one channel of the variable current source 110 supplies current to the series connected arc-shaped segments 330, 340. Such a configuration may be applied to all of the arc-shaped segments of the matrix coil, or to only a fraction of the total number of arc-shaped segments. By coupling two or more of the arc-shaped segments 330, 340 in series, the apparent density of arc-shaped segments can be increased (due to two or more arc-shaped segments in different loops), resulting in an increased magnetic field magnitude, without increasing the amount of current provided to any one arc-shaped segment. However, the series connection between the arc-shaped segment 330 and the arc-shaped segment 340 should take place sufficiently outside of the matrix coil as shown in FIG. 3, in order to inhibit magnetic interference related to the series connection. As such, in a preferred configuration, the current leads 320 within the matrix coil are preferably arranged to be substantially parallel to the common axis 160 as much as possible. This may or may not result in a slight offset between the arc-shaped segments 330, 340 as shown in FIG. 3.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A matrix coil for generating a variable magnetic field, comprising:
    a plurality of loops arranged in a series so as to have a substantially common axis, each of the plurality of loops being segmented into at least one arc-shaped segment;
    a variable current source for each of the arc-shaped segments; and
    a controller configured to selectively vary an amount of current provided to each of the arc-shaped segments by the variable current sources so as to achieve a variable base field, one or more variable gradient fields, and one or more variable second order shim fields.

2. The matrix coil of claim 1, wherein arc-shaped segments in consecutive loops are offset in a radial direction from one another.

3. The matrix coil of claim 1, wherein the current source comprises a multi-channel amplifier, each channel of the multi-channel amplifier corresponding to the current source for an individual arc-shaped segment.

4. The matrix coil of claim 1,
    wherein at least two arc-shaped segments in different loops are connected in series, and
    wherein a single current source supplies current to the series connected arc-shaped segments.

5. The matrix coil of claim 1, further comprising a current lead coupling each current source to a respective arc-shaped segment, the current leads being substantially parallel to the common axis.

6. The matrix coil of claim 5, wherein the current leads have a sufficient thickness to limit joule heat generated therein to a value less than about 10 W.

7. The matrix coil of claim 1, further comprising an array of current elements connected by current leads substantially parallel to the common axis.

8. The matrix coil of claim 1, wherein a target field for an imaging region of interest is achieved by selectively varying the amount of current provided to each of the arc-shaped segments in accordance with a discrete approximation of a gradient current density stream function.

9. The matrix coil of claim 8, wherein the target field is achieved by selectively varying the amount of current provided to each of N arc-shaped segments in accordance with the following equation:

$$B_z(r_m) = \frac{\mu}{4\pi} \sum_{n=1}^{N} I_n \oint \frac{ds[\varphi \cdot (r'_n - r_m)]_Z}{|r'_n - r_m|^3}$$

where $r_m$ are the $m^{th}$ sample point in the target field, m being an integer greater than 1, and
where $r_n$ are position current elements $ds_n$ along the $n^{th}$ arc of the N arc-shaped segments, N being an integer greater than 1.

10. The matrix coil of claim 9, wherein the variable second order shim field(s) is achieved by selectively varying the amount of current provided to each of the arc-shaped segments in accordance with the following equations:

$$I_q = \frac{4\pi}{\mu} \sum_q \sum_m (A_{qm}^T A_{mn})^{-1} A_{nm}^T B_{z,m}$$

$$A_{mn} = \oint \frac{ds[\varphi \circ (r'_n - r_m)]_Z}{|r'_n - r_m|^3}.$$

11. The matrix coil of claim 1, wherein the plurality of loops are spaced apart at a substantially equal distance along the common axis.

12. The matrix coil of claim 1, wherein end loops of the plurality of loops include more conductive material than a middle loop of the plurality of loops.

13. The matrix coil of claim 1, wherein the controller includes a look-up table listing the amount of current provided to each of the plurality of loops to achieve a target field for an imaging region of interest.

14. The matrix coil of claim 1, wherein the matrix coil includes at least 32 loops, each of the at least 32 loops being segmented into at least 8 arc-shaped segments.

15. The matrix coil of claim 1, wherein the plurality of loops are arranged about a substantially cylinder substrate.

16. The matrix coil of claim 15, wherein the substantially cylinder substrate has a diameter of at least 70 cm and a length of at least 200 cm.

17. The matrix coil of claim 1, wherein the plurality of loops are potted in epoxy with a fiberglass reinforcing structure.

18. A magnetic resonance imaging device including the matrix coil of claim 1.

19. A method of generating a variable magnetic field, comprising:
    supplying a current to each of a plurality of arc-shaped segments within each of a plurality of loops, the plurality of loops being arranged in a series so as to have a substantially common axis; and
    selectively varying the supplied current provided to each of the plurality of arc-shaped segments to achieve a variable base field, one or more variable gradient fields, and one or more variable second order shim fields.

20. The method of claim 19, further comprising:
    supplying a current to an array of current elements connected by current leads substantially parallel to the common axis; and
    selectively varying the supplied current provided to the array of current elements to achieve the variable base field, one or more variable gradient fields, and one or more variable second order shim fields.

21. The method of claim 19, further comprising:
    retrieving target current amounts for each of a plurality of arc-shaped segments from a look-up table based on a desired base field, one or more variable gradient fields, and one or more variable second order shim fields.

22. The method of claim 19, further comprising:

calculating target current amounts for each of the plurality of arc-shaped segments to achieve a target field for an imaging region of interest in accordance with the following equation:

$$B_z(r_m) = \frac{\mu}{4\pi} \sum_{n=1}^{N} I_n \oint \frac{d_s[\varphi \circ (r'_n - r_m)]_Z}{|r'_n - r_m|^3}$$

where $r_m$ are the $m^{th}$ sample point in the target field, m being an integer greater than 1, and where $r_n$ are position current elements $ds_n$ along the $n^{th}$ arc of the N arc-shaped segments, N being an integer greater than 1.

23. The method of claim 22, further comprising:

calculating target current amounts for each of the plurality of arc-shaped segments to achieve the variable second order shim field(s) in accordance with the following equations:

$$I_q = \frac{4\pi}{\mu} \sum_q \sum_m (A_{qm}^T A_{mn})^{-1} A_{nm}^T B_{z,m}$$

$$A_{mn} = \oint \frac{d_s[\varphi \circ (r'_n - r_m)]_Z}{|r'_n - r_m|^3}.$$

24. A magnetic resonance imaging device, comprising:

means for generating a variable base field, one or more variable gradient fields, and one or more variable second order shim fields;

means for supplying a current to the means for generating so as to achieve a target field for an imaging region of interest; and means for determining a required current to achieve the target field for the imaging region of interest.

* * * * *